(12) United States Patent
Chiu

(10) Patent No.: US 7,148,757 B2
(45) Date of Patent: Dec. 12, 2006

(54) CHARGE PUMP-BASED PLL HAVING DYNAMIC LOOP GAIN

(75) Inventor: Hon Kin Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 30 days.

(21) Appl. No.: 11/060,982

(22) Filed: Feb. 18, 2005

(65) Prior Publication Data

US 2005/0156684 A1 Jul. 21, 2005

Related U.S. Application Data

(63) Continuation of application No. 10/453,757, filed on Jun. 2, 2003, now abandoned.

(51) Int. Cl.
*H03L 7/00* (2006.01)
(52) U.S. Cl. .......................... 331/16; 331/1 A; 331/17; 327/156; 327/157
(58) Field of Classification Search ................ 331/1 A, 331/16, 17; 327/156, 157
See application file for complete search history.

(56) References Cited

U.S. PATENT DOCUMENTS 5,668,503 A * 9/1997 Gersbach et al. ........... 331/1 A

* cited by examiner

*Primary Examiner*—Arnold Kinkead
(74) *Attorney, Agent, or Firm*—Merchant & Gould P.C.; Mark R. Hennings

(57) ABSTRACT

A charge pump-based PLL dynamically controls loop gain in response to the frequency of an input signal. The loop gain is dynamically adjusted by varying the bias current of the charge pump circuit of the PLL. The bias current is varied in response to the voltage of a loop filter that is coupled to the output of the charge pump circuit. A voltage-to-current converter ("V/I converter") converts the voltage of the loop filter to a current. The current is mirrored to a dynamic bias generator. The dynamic bias generator comprises a sample-and-hold circuit that is used to sample the mirrored current when the charge pump circuit is temporarily switched off. The sampled current level is used to adjust the level of the bias current of the charge pump circuit. The switching the charge pump off minimizes the disturbance of the loop filter voltage by the charge pump.

25 Claims, 2 Drawing Sheets

CHARGE PUMP-BASED PLL HAVING DYNAMIC LOOP GAIN

RELATED APPLICATIONS

This patent application is a continuation-in-part of U.S. patent application Ser. No. 10/453,757 filed Jun. 2, 2003, now abandoned entitled "Charge Pump-Based PLL Having Dynamic Loop Gain," the disclosure of which is expressly incoxporated herein by reference.

FIELD OF THE INVENTION

The present invention relates generally to phase-locked loop (PLL) circuits, and more particularly to PLL circuits having dynamic loop gain.

BACKGROUND OF THE INVENTION

The maximum allowable global loop gain of a charge pump-based PLL typically decreases in accordance with a decrease of the frequency of an input signal for the PLL. The loop stability of a PLL can be maintained by varying the loop gain of the PLL in response to changes in the frequency of the input signal. Varying the loop gain for the purpose of maintaining loop stability can be a problem in situations where a circuit is constrained from using additional input or output pins.

An appreciation of the present invention and its improvements can be obtained by reference to the accompanying drawings, which are briefly summarized below, to the following detailed description of illustrated embodiments of the invention, and to the appended claims.

DETAILED DESCRIPTION OF THE PREFERRED EMBODIMENT

Figure 1:
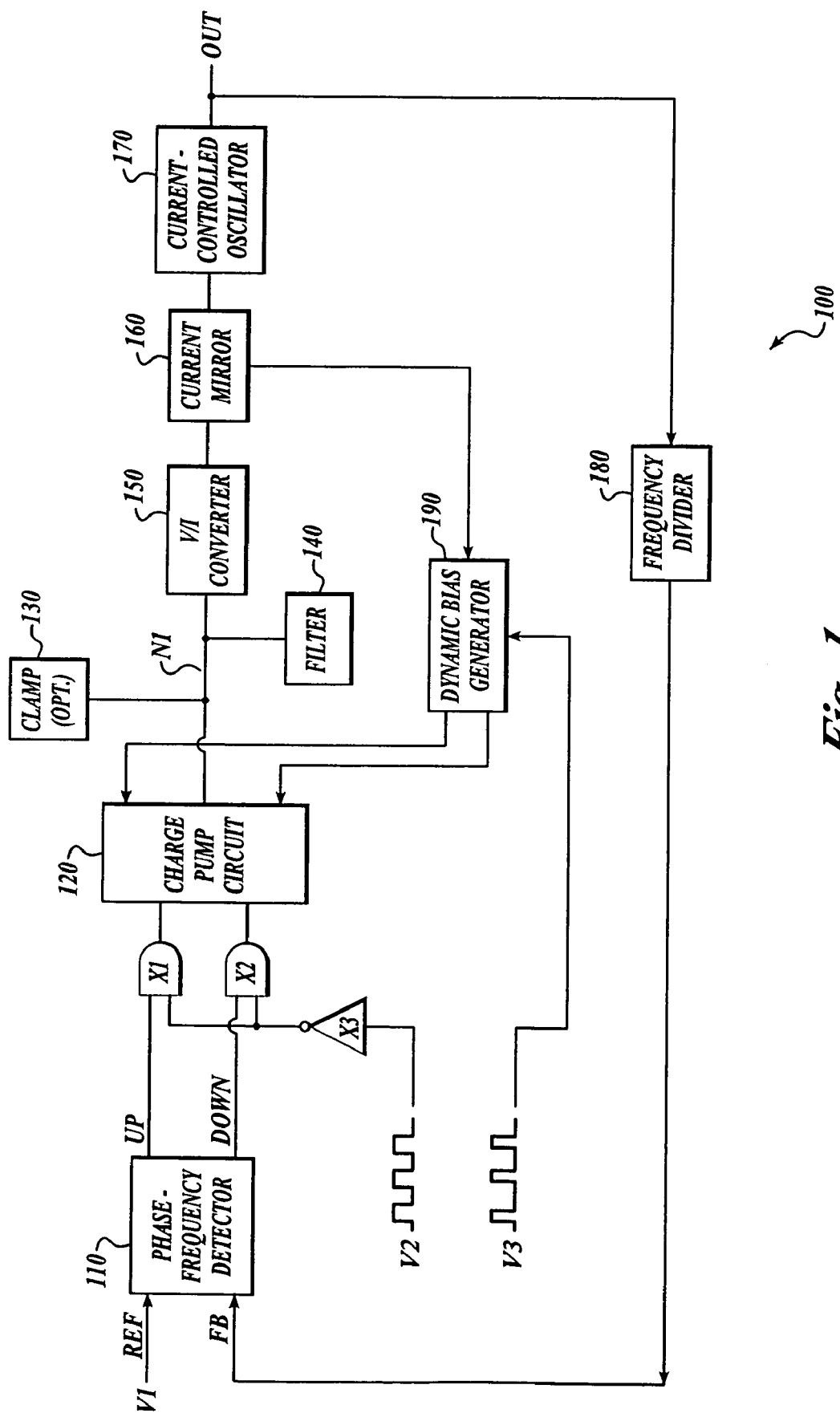
FIG. 1 is a top-level block diagram of an example charge pump-based PLL used in accordance with the present invention.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

The present invention is directed towards a charge pump-based PLL having a dynamically controlled loop gain. The loop gain is dynamically adjusted by varying the bias current of the charge pump circuit of the PLL. The bias current is varied in response to the voltage of a loop filter that is coupled to the output of the charge pump circuit. A voltage-to-current converter ("V/I converter") converts the voltage of the loop filter to a current that is mirrored to a dynamic bias generator. The dynamic bias generator comprises a sample-and-hold circuit that is used to sample the mirrored current when the charge pump circuit is temporarily switched off. The sampled current level is used to adjust the level of the bias current of the charge pump circuit. Switching the charge pump off minimizes the disturbance of the loop filter voltage by the charge pump.

FIG. 1 is a top-level block diagram of an example charge pump-based PLL used in accordance with the present invention. The figure illustrates PLL 100 in which the loop gain is dynamically controlled in response to the frequency of an input signal to the PLL. PLL 100 comprises phase-frequency detector 110, logic gates X1–X3, charge pumps circuit 120, optional clamp 130, loop filter 140, V/I converter 150, current year 160, current-controlled oscillator 170, frequency divider 180, and dynamic bias generator 190.

In operation, phase-frequency detector 110 of PLL 100 is configured to receive a first input signal at node V1 and a feedback signal at node fb (the generation of the feedback signal is discussed below). Phase-frequency detector 100 compares the phases of the first input signal in the feedback signal and generates a correction signal in response. As shown in the figure, the correction signal may be embodied as an "up" signal and a "down" signal. The correction signal is used in controlling the phase of the feedback signal.

In the illustrated embodiment of the invention, the first input signal may be used in pixel clock synthesis, where the first input signal is used as a horizontal synchronization signal. The second and third input signals (applied at nodes V2 and V3 respectively) may be applied, for example, at a vertical synchronization frequency. The third input signal typically has a duty cycle that is less than the duty cycle of the second input signal. The second and third input signals typically have the same pulse repetition frequency. Additionally, the third input signal is typically active only during periods of time in which the second input signal is also active. According to an embodiment, the signals are digital signals for controlling switches, although other signals can be used, such as signals that are suitable for biasing transistors.

Logic gates X1–X3 are configured to disable charge pump circuit 120 in response to the second input signal. For example, charge pump circuit 120 can be disabled when the second input signal is low. When the second input signal is high, logic gates X1–X3 pass the status of the up and down control signals to charge pump circuit 120.

Charge pump circuit 120 is configured to assert a voltage at node N1 in response to the status of the up and down control signals. Additionally, charge pump circuit 120 adjusts the asserted voltage in response to bias signals from the dynamic bias generator 190 (discussed below).

Clamp 130 is optional and may be coupled to node N1 such that the voltage present at node N1 does not exceed a predetermined level. Loop filter 140 is also coupled to node N1 and cooperates with charge pump circuit 120 such that the asserted voltage is proportional to the frequency of the first input signal.

V/I converter 150 generates a current in response to the asserted voltage. Current mirror 160 mirrors the current from V/I converter 150 and applies mirrored currents to current-controlled oscillator 170 and dynamic bias generator 190.

Current-controlled oscillator 170 generates an output signal in response to the mirrored current. The output signal has a frequency that is proportional to the mirrored current. The output signal is further coupled to frequency divider 180.

Frequency divider 180 is configured to produce a divided frequency signal at node fb in response to the output signal. The frequency of the divided frequency signal is typically an integer multiple of the frequency of the output signal, although other non-integer ratios are possible. Frequency divider 180 may be configured as a divide by "N" counter, although other architectures are possible.

Dynamic bias generator 190 is configured to apply bias signals to charge pumps circuit 120 in response to the third input signal and the mirrored current from current mirror 160. The operation of dynamic bias generator 190 and other cooperating circuits is described more fully with respect to FIG. 2.

Figure 2:
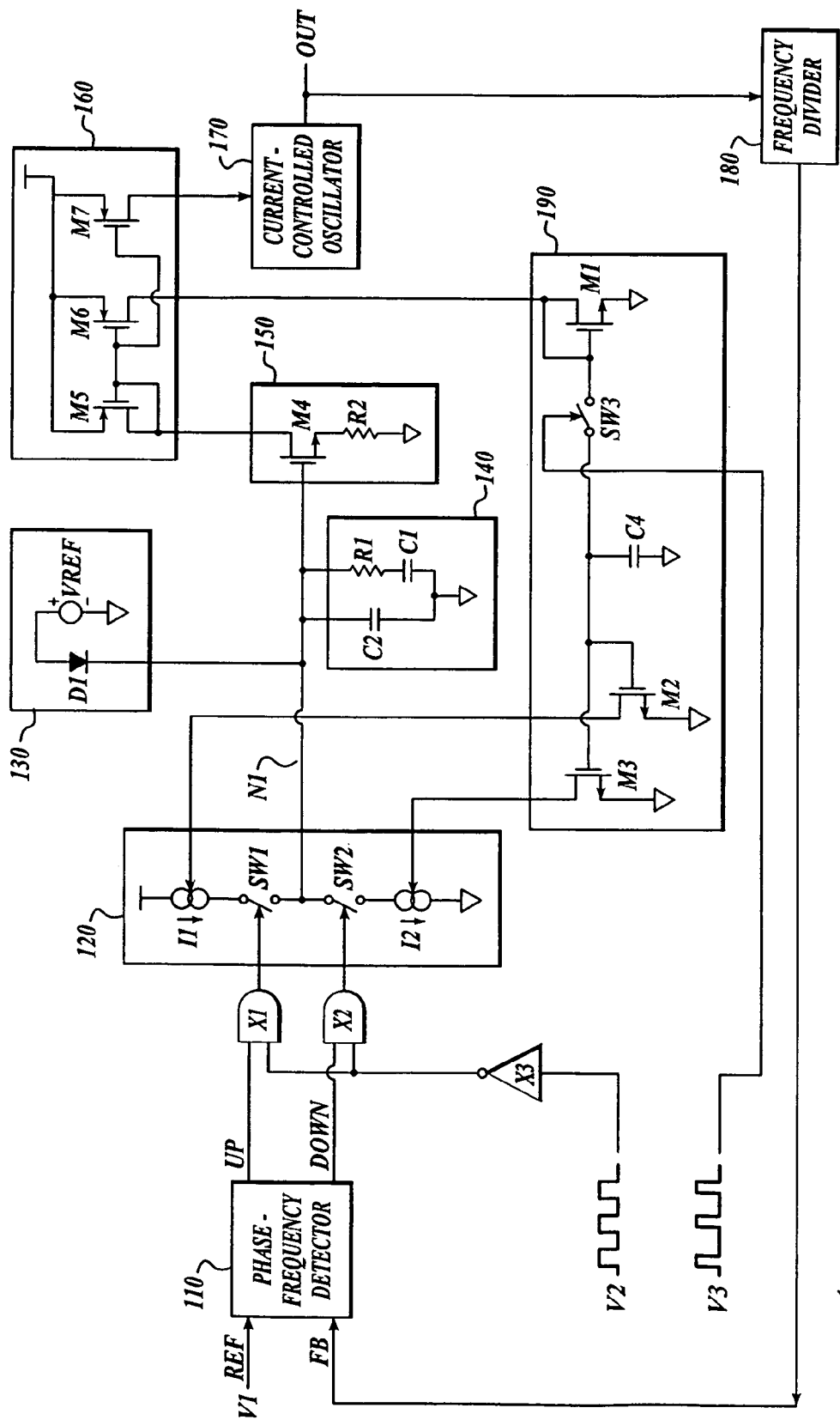
FIG. 2 is a schematic diagram of an example charge pump-based PLL used in accordance with the present invention.

FIG. 2 is a schematic diagram of an example charge pump-based PLL used in accordance with the present invention. Charge pump circuit 120 comprises current sources I1–I2 and switches SW1 and SW2. Optional clamp 130 comprises a diode D1 and a voltage reference. Loop filter 140 comprises capacitors C1–C2 and resistor R1. V/I converter 150 comprises transistor M4 and resistor R2. Current mirror 160 comprises transistors M5–M7. Dynamic bias generator 190 comprises transistors M1–M4, capacitor C4, and switch SW3.

In operation, PLL 100 effectively measures the voltage across capacitor C1 by opening switches SW1 and SW2 simultaneously. When the second input signal is asserted (e.g., high), the outputs of logic gates X1 and X2 are both negated (e.g., low), which opens switches SW1 and SW2. Simultaneously opening switches SW1 and SW2 isolates charge pump circuit 120 from node N1, which is coupled to loop filter 140 (which comprises capacitor C1). Isolating charge pump circuit 120 from node N1 removes the influence of the charge pump upon the voltage at node N1, which effectively allows the voltage across C1 to be present at node N1.

As discussed above, the voltage at node N1 is converted to a current by V/I converter 150. The current is applied to current mirror 160 where the applied current is mirrored. The mirrored currents are individually applied to current-controlled oscillator 170 and transistor M1 of dynamic bias generator 190. Transistor M1 converts the applied mirrored current to a voltage that is applied to a terminal of switch SW3.

Switch SW3 is configured to open and close in response to the third input signal. When switch SW3 is closed, the voltage produced by transistor M1 can be sampled by capacitor C4 (as well is applied to the gates of transistors M2 and M3). Switch SW3 is typically only open when charge pump 120 is isolated from node N1 because of the relationship between the second and third input signals, which thus allows the voltage across capacitor C1 to be effectively sampled. When switch SW3 is open, capacitor C4 stores the sampled voltage (as a stored charge).

Accordingly, the voltage produced by transistor M1 is applied to the gates of transistors M2 and M3 either directly, or as a voltage produced by a stored charge. Transistors M2 and M3 each produce a bias current that is applied to current sources I1 and I2, respectively. Current sources I1 and I2 each produce currents in response to the applied bias currents. When switch SW1 is closed, current source I1 operates to transfer charge to node N1 (which increases the voltage at node N1). When switch SW2 is closed, current source I2 operates to transfer charge away from node N1 (which decreases the voltage at node N1). Thus the voltage across capacitor C1 can be used to control the voltage present at node N1.

PLL 100 uses the sampled effective voltage of capacitor C1 to dynamically control the loop gain in response to the frequency of the first input signal. As the frequency of the first input signal decreases, the output current of V/I converter 150 decreases. The output bias currents of dynamic bias generator 190 decrease in response to the decrease of the V/I converter output current. The decrease in the bias currents reduces the charge pump currents that are supplied by current sources I1 and I2. As the frequency of the first input signal increases, the output current of V/I converter 150 increases. The output bias currents of dynamic bias generator 190 increase in response to the increase of the V/I converter output current. The increase in the bias currents increases the charge pump currents that are supplied by current sources I1 and I2.

Various embodiments of the invention are possible without departing from the spirit and scope of the invention. For example, the present invention can be used in circuits other than circuits used in pixel clock synthesis applications. The above specification, examples and data provide a complete description of the manufacture and use of the composition of the invention. Since many embodiments of the invention can be made without departing from the spirit and scope of the invention, the invention resides in the claims hereinafter appended.

I claim:

1. A FLL circuit, comprising:
    a charge pump circuit that is configured to add charge to a node using a first current source when coupled to the node and remove charge from the node using a second current source when coupled to the node;
    a loop filter that is configured to convert the node charge to a node voltage; and
    a dynamic bias generator that is configured to sample the node voltage when the first and second current sources are not coupled to the node and to bias the first and second current sources such that the first current source is arranged to add charge to the node in response to the node voltage and the second current source is arranged to remove charge from the node in response to the node voltage.

2. The circuit of claim 1, wherein the first and second current sources are configured to be coupled to the node in response to a correction signal.

3. The circuit of claim 2, wherein the correction signal contains information for performing one of adding charge to the node and removing charge from the node.

4. The circuit of claim 1, wherein the dynamic bias generator comprises a switching circuit and a capacitor that are configured to sample discontinuously evaluate the the node voltage.

5. The circuit of claim 1, further comprising a voltage-to-current converter that is configured to convert the node voltage to a first current.

6. The circuit of claim 5, further comprising a current mirror that is configured to mirror the first current to generate a first mirrored current that is applied to the dynamic bias generator.

7. The circuit of claim 6, wherein the current mirror is further configured to mirror the first current to generate a second minored current that is applied to a current-controlled oscillator.

8. The circuit of claim 7, further comprising a phase-frequency detector that is configured to generate the correction signal in response to an output of the current-controlled oscillator.

9. A method for dynamically biasing the loop gain of a PLL, comprising:
 generating a correction signal in response to comparing an input signal with an output of an oscillator of the PLL;
 coupling in response to the correction signal, a first current source to the node such that charge is added to the node;
 coupling in response to the correction signal, a second current source to the node such that charge is removed from the node;
 converting the node charge to a node voltage;
 sampling the node voltage when the first and second current sources are not coupled to the node, wherein the sampling occurs at discontinuous intervals;
 biasing the first current source such that the first current source adds charge to the node in response to the sampled node voltage; and
 biasing the second current source such that the second current source removes charge from the node in response to the sampled node voltage.

10. The method of claim 9, wherein the correction signal contains information for performing one of adding charge to and removing charge from the node.

11. The method of claim 9, wherein the node voltage is sampled using a switching circuit and a capacitor.

12. The method of claim 9, further comprising converting the node voltage to a first current.

13. The meted of claim 12, further comprising mirroring the first current and applying the mirrored current to the oscillator.

14. The method of claim 9, wherein the node voltage is sampled by sampling a buttered node voltage.

15. A circuit for dynamically biasing the loop gain of a PLL, comprising:
 means for generating a correction signal by comparing an input signal with an output of an oscillator of the PLL;
 means for coupling a first current source to the node such that charge is added to the node, wherein the means for coupling operates in response to the correction signal;
 means for coupling a second current source to the node such that charge is added to the node, wherein the means for coupling operates in response to the correction signal;
 means for converting the node charge to a node voltage;
 means for sampling the node voltage when the first and second current sources are not coupled to the node, wherein the sampling occurs at discontinuous intervals;
 means for biasing the first current source such that the first current source adds charge to the node in response to the sampled node voltage; and
 means for biasing the second current source such that the first current source adds charge to the node in response to the sampled node voltage.

16. The circuit of claim 15, wherein the correction signal contains information for performing one of adding charge to and removing charge from the node.

17. The circuit of claim 15, wherein the node voltage is sampled using a switch and a capacitor.

18. The circuit of claim 15, further comprising means for converting the node voltage to a first current.

19. The circuit of claim 18, further comprising means for mirroring the first current and applying the mirrored current to the oscillator.

20. The circuit of claim 9, wherein the node voltage is sampled by sampling a buffered node voltage.

21. A PLL circuit, comprising:
 a charge pump circuit tat is configured to add charge to a node using a first current source when coupled to the node and remove charge from the node using a second current source when coupled to the node;
 a loop filter that is configured to convert the node charge to a node voltage; and
 a dynamic bias generator that is configured to discontinuously evaluate the node voltage when the first and second current sources are not coupled to the node and to bias the first and second current sources such that the first current source is arranged to add charge to the node in response to the node voltage and the second current source is arranged to remove charge from the node in response to the node voltage, and wherein the dynamic bias generator comprises a switching circuit and a capacitor that are configured to discontinuously evaluate the node voltage.

22. The circuit of claim 21, further comprising a voltage-to-current converter that is configured to convert the node voltage to a first current.

23. The circuit of claim 22, further comprising a current mirror that is configured to mirror the first current to generate a first mirrored current that is applied to the dynamic bias generator.

24. The circuit of claim 23, wherein the current mirror is further configured to mirror the first current to generate a second mirrored current that is applied to a current-controlled oscillator.

25. The circuit of claim 24, further comprising a phase-frequency detector that is configured to generate the correction signal in response to an output of the current-controlled oscillator.

* * * * *

UNITED STATES PATENT AND TRADEMARK OFFICE
CERTIFICATE OF CORRECTION

| | | |
|---|---|---|
| PATENT NO. | : 7,148,757 B2 | Page 1 of 1 |
| APPLICATION NO. | : 11/060982 | |
| DATED | : December 12, 2006 | |
| INVENTOR(S) | : Hon Kin Chiu | |

It is certified that error appears in the above-identified patent and that said Letters Patent is hereby corrected as shown below:

Column 4, line 43: "A FLL circuit," should read -- A PLL circuit, --

Column 4, line 66: "sample discontinuously evaluate the the node" should read -- sample the node --

Column 5, line 10: "second minored current" should read -- second mirrored current --

Column 5, line 28-29: "not coupled to the node, wherein the sampling occurs at discontinuous intervals;" should read -- not coupled to the node; --

Column 6, line 3-4: "not coupled to the node, wherein the sampling occurs at discontinuous intervals;" should read -- not coupled to the node; --

Column 6, line 24: "circuit tat" should read -- circuit that --

Signed and Sealed this

Eighteenth Day of November, 2008

JON W. DUDAS
*Director of the United States Patent and Trademark Office*